(12) United States Patent
Haba

(10) Patent No.: US 6,449,159 B1
(45) Date of Patent: Sep. 10, 2002

(54) SEMICONDUCTOR MODULE WITH IMBEDDED HEAT SPREADER

(75) Inventor: Belgacem Haba, Cupertino, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/564,064

(22) Filed: May 3, 2000

(51) Int. Cl.$^7$ .................................................. H05K 7/20
(52) U.S. Cl. ..................... 361/707; 361/704; 361/737; 361/749; 361/715; 257/719; 174/16.3; 165/185
(58) Field of Search ................................ 361/690, 704, 361/707, 714–721, 749, 750; 257/723, 712; 174/52.4, 250–252

(56) References Cited

U.S. PATENT DOCUMENTS

| | | | | |
|---|---|---|---|---|
| 5,229,916 A | * | 7/1993 | Frankeny et al. | 361/718 |
| 5,276,418 A | * | 1/1994 | Klosowiak et al. | 361/704 |
| 5,386,341 A | * | 1/1995 | Olson et al. | 361/749 |
| 5,751,553 A | * | 5/1998 | Clayton | 361/749 |
| 5,925,934 A | | 7/1999 | Lim | 257/778 |
| 5,926,369 A | * | 7/1999 | Ingraham et al. | 361/699 |
| 5,959,839 A | * | 9/1999 | Gates | 361/704 |
| 5,963,427 A | * | 10/1999 | Bollesen | 361/704 |
| 5,995,370 A | * | 11/1999 | Nakamori | 361/704 |
| 6,002,589 A | | 12/1999 | Perino et al. | 361/749 |
| 6,034,878 A | | 3/2000 | Osaka et al. | 365/52 |
| 6,040,624 A | * | 3/2000 | Chambers et al. | 257/692 |

* cited by examiner

Primary Examiner—Boris L. Chervinsky
(74) Attorney, Agent, or Firm—Pennie & Edmonds LLP

(57) ABSTRACT

The invention provides a semiconductor module comprising a heat spreader, at least two semiconductors thermally coupled to the heat spreader, and a plurality of electrically conductive leads electrically connected to the semiconductors. The leads may form part of a flexible circuit at least partially attached to the heat spreader, where at least one of the electrically conductive leads is preferably common to both of the semiconductors. The two semiconductors may be mounted or preferably directly bonded onto opposing side walls of the heat spreader. The invention also provides a method of making the abovementioned semiconductor module.

35 Claims, 11 Drawing Sheets

SEMICONDUCTOR MODULE WITH IMBEDDED HEAT SPREADER

TECHNICAL FIELD

The present invention relates generally to semiconductor packaging and in particular to a semiconductor module with an imbedded heat spreader.

BACKGROUND OF THE INVENTION

The semiconductor industry is constantly producing smaller and more complex semiconductors, sometimes called integrated circuits or chips. This trend has brought about the need for smaller chip packages with smaller footprints, higher lead counts, and better electrical and thermal performance, while at the same time meeting accepted reliability standards.

In recent years a number of microelectronic packages have been produced to meet the need for smaller chip packaging. One such package is referred to as a chip scale package (CSP). CSPs are so called because the total package size is similar or not much larger than the size of the chip itself. Typically, the CSP size is between 1 and 1.2 times the perimeter size of the chip, or 1.5 times the area of the die. One example of a CSP is a product developed by TESSERA® called "MICRO BGA" or μBGA. In a CSP, the semiconductor has a set of bond pads distributed across its surface. A first surface of an insulating, flexible film is positioned over the semiconductor surface. Interconnect circuitry is positioned within the film. Electrical connections are made between the interconnect circuitry and the semiconductor bond pads. Solder balls are subsequently attached to a second surface of the film in such a manner as to establish selective connections with the interconnect circuitry. The solder balls may then be attached to a printed circuit board.

CSPs may be used in connection with memory chips. Memory chips may be grouped to form in-line memory modules. In-line memory modules are surface mounted memory chips positioned on a circuit board.

As memory demands increase, so does the need for increased memory capacity of in-line memory modules. A need has also arisen for materials and methods that lead to increased performance by more closely matching the coefficient of thermal expansion of the materials used in these memory modules. Examples of such in-line memory modules are single in line memory modules or SIMMs and dual in-line memory modules or DIMMs. DIMMs have begun to replace SIMMs as the compact circuit boards of preference and essentially comprise a SIMM wherein memory chips are surface mounted to opposite sides of the circuit board with connectors on each side.

A problem with in-line memory modules is that adding more chips to the circuit board spreads out the placement of the chips on the circuit card and therefore requires reconfiguration of the circuit card connectors and their associated connections on the motherboard, which means replacing the memory card and in some cases the motherboard.

Another problem with current in-line memory modules is that a separate heat spreader must be positioned across a set of memory chips. The heat spreader adds cost to the assembly process and adds significant weight to the module.

In view of the foregoing it would be highly desirable to provide a semiconductor module that overcomes the shortcomings of prior art devices.

SUMMARY

According to the invention there is provided a semiconductor module comprising a heat spreader, at least two semiconductors thermally coupled to the heat spreader, and a plurality of electrically conductive leads electrically connected to the semiconductors. The leads may form part of a flexible circuit at least partially attached to the heat spreader, where at least one of the electrically conductive leads is common to both of the semiconductors. The two semiconductors may be directly bonded onto opposing side walls of the heat spreader.

According to the invention there is also provided a method of making a semiconductor module. A plurality of electrically conductive leads are provided, preferably on a flexible circuit or tape. Two semiconductors are then electrically connected to the leads. The semiconductors are then thermally coupled to a heat spreader. This may be done by mounting the semiconductor directly to opposing walls of the heat spreader. The leads may then be soldered to a printed circuit board. The module may also be anchored to the printed circuit board by means of a fastening mechanism.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
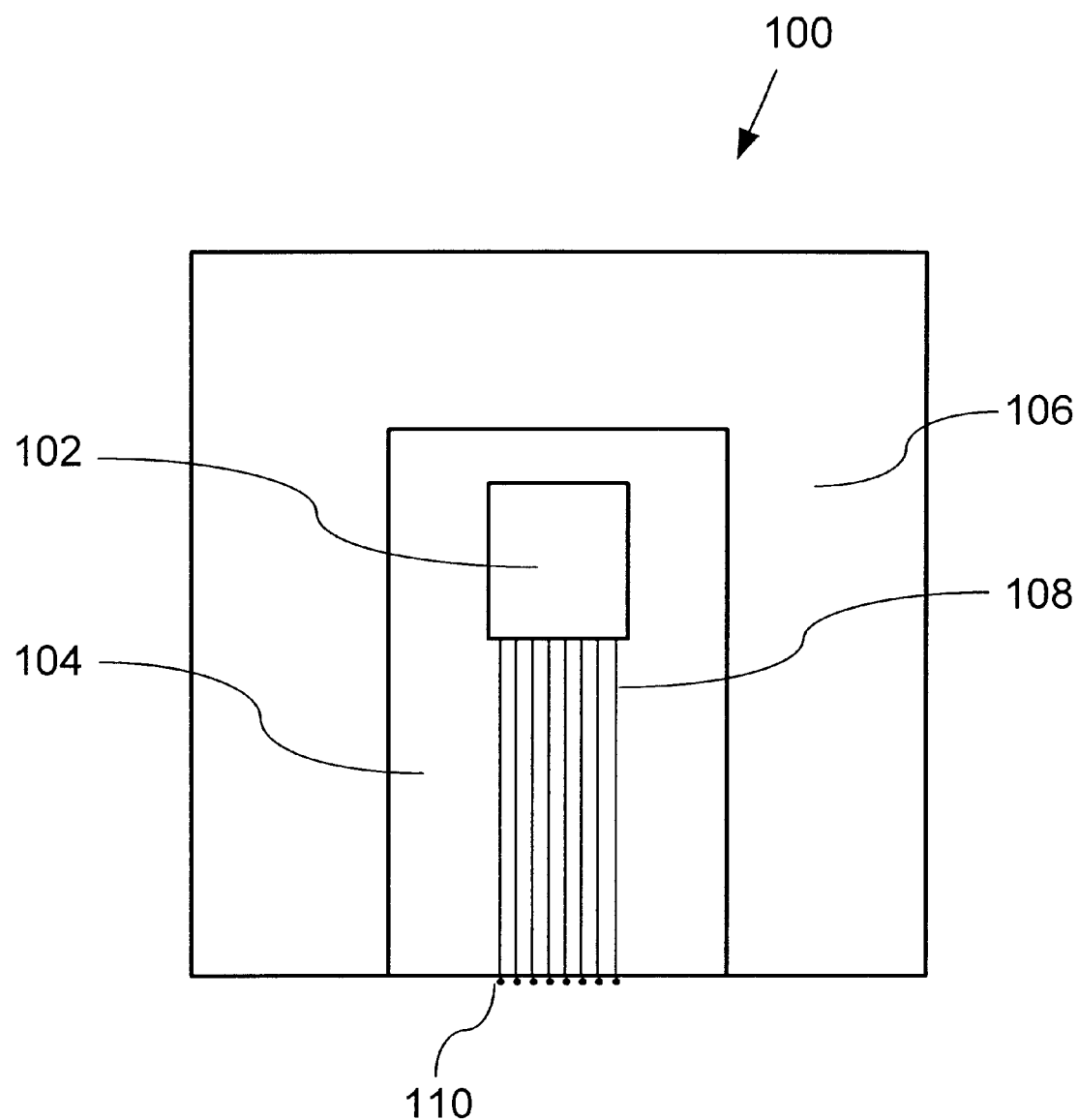
FIG. 1 is a front view of a semiconductor module according to an embodiment of the invention.

FIG. 1 is a front view of a semiconductor module 100 according to an embodiment of the invention. A semiconductor 102 is electrically connected to a plurality of traces or electrically conductive leads 108 by any conventional method such as wire bonding or thermocompression bonding. The electrically conductive leads 108 may be incorporated into flexible circuitry or tape 104, which preferably consists of copper traces within a thin dielectric substrate (such as polyimide, epoxy, etc.).

As shown in FIG. 1, the flexible circuitry 104 may be bonded, with an epoxy or the like, directly onto the side of the heat spreader 106. The heat spreader 106 is preferably made from a material with good heat dissipation properties, such as a metal.

In a preferred embodiment, two semiconductors 102 are positioned on opposing sides of the heat spreader 106. The leads 108 preferably run the length of each sides of the heat spreader 106, culminating at electrical contact points 110 at the base of the heat spreader 106. Electrical contact points 110 may for example comprise solder balls or bond pads. The semiconductors may further comprise of single dies or multiple stacked dies.

Figure 2:
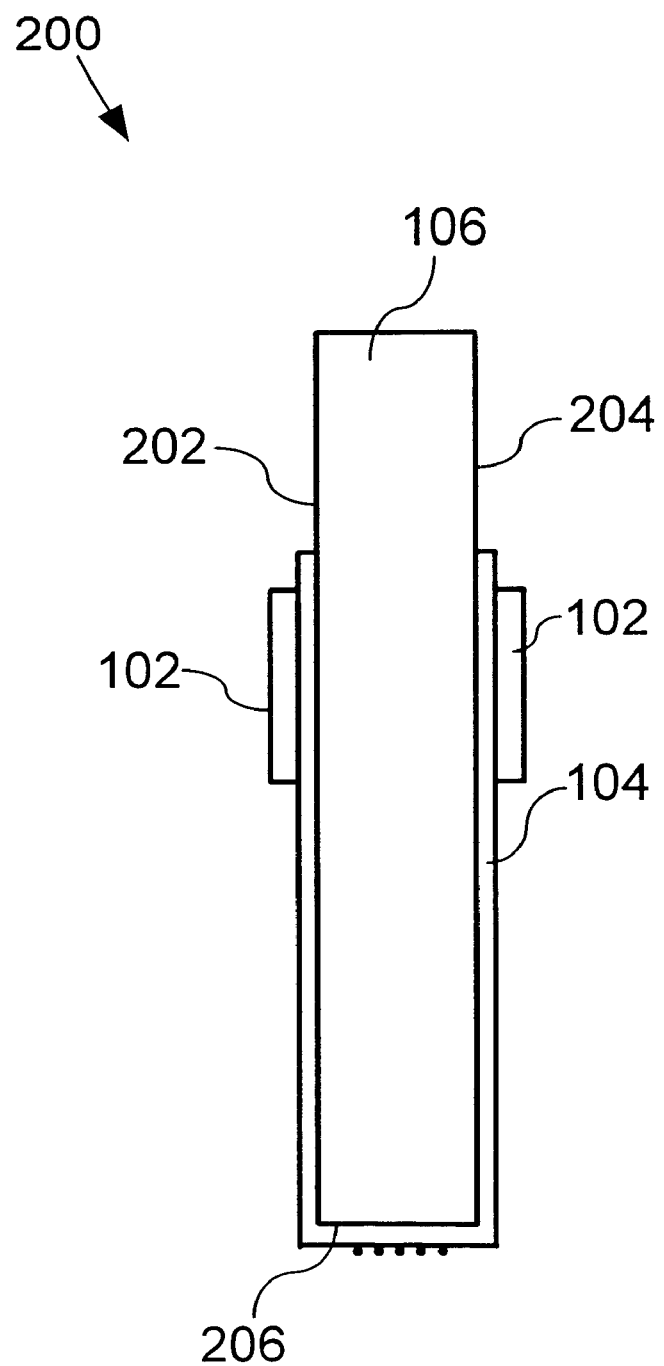
FIG. 2 is a side view of the semiconductor module shown in FIG. 1.

FIG. 2 is a side view of the semiconductor module 200 shown in FIG. 1. This view shows the semiconductors 102 and the flexible circuit 104 attached to both sides of the heat spreader 106. As can be seen, the flexible circuit 104 wraps around the sides walls 202 and 204 and base 206 of the heat spreader 106.

Figure 3:
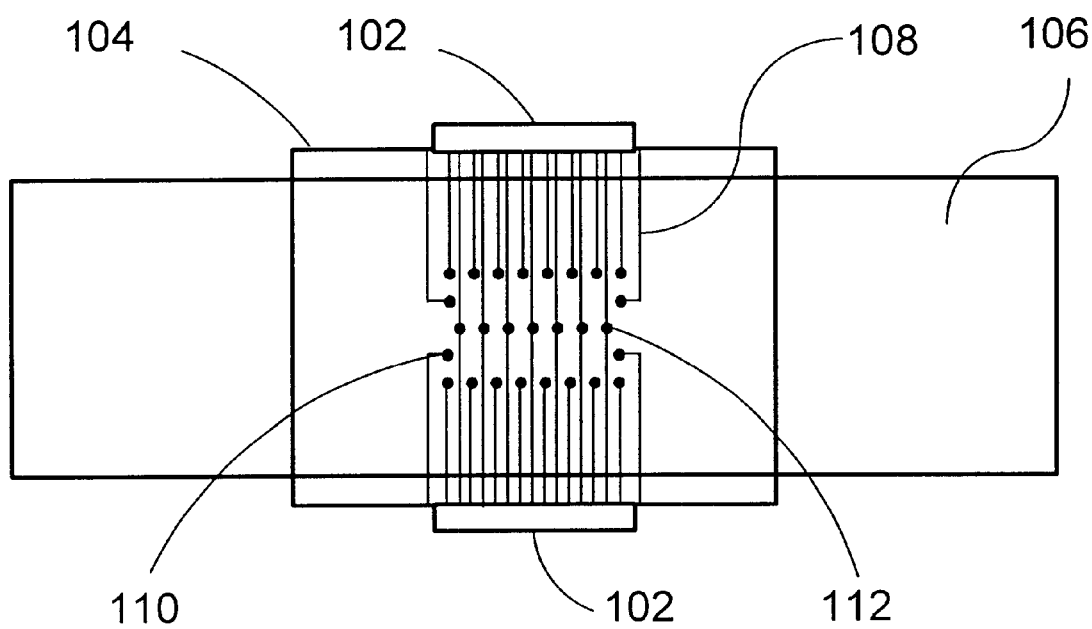
FIG. 3 is an underside view of the semiconductor module shown in FIG. 1.

FIG. 3 is an underside view of the semiconductor module shown in FIG. 1.

This figure more clearly shows the array of electrical contact points 110. Each lead 108 connects a semiconductor 102 to a distinct contact point 110. However, certain of the contact points 112 are common to both semiconductors 102. In this case, a single lead 108 connects both semiconductors 102 to a shared common contact point 112. Common contact points 112 may include a common voltage supply node, a reference voltage node, or the electrical ground node. Shared contact points 112 reduce the overall number of leads 108 and contact points 110 needed and therefore reduces the footprint of the module. The contact points 110 may be implemented as solder bumps or balls, metal points, or any other electrical connection. An advantage of placing the contact points at the base of the heat spreader 106 is that the contact points 110, being remote from the semiconductor 102, do not experience major temperature variations and therefore have reduced thermal mismatch stress. Thermal mismatch stress is caused by the low thermal expansion of the semiconductor 102 relative to the typically much higher expansion of a printed circuit board.

Figure 4:
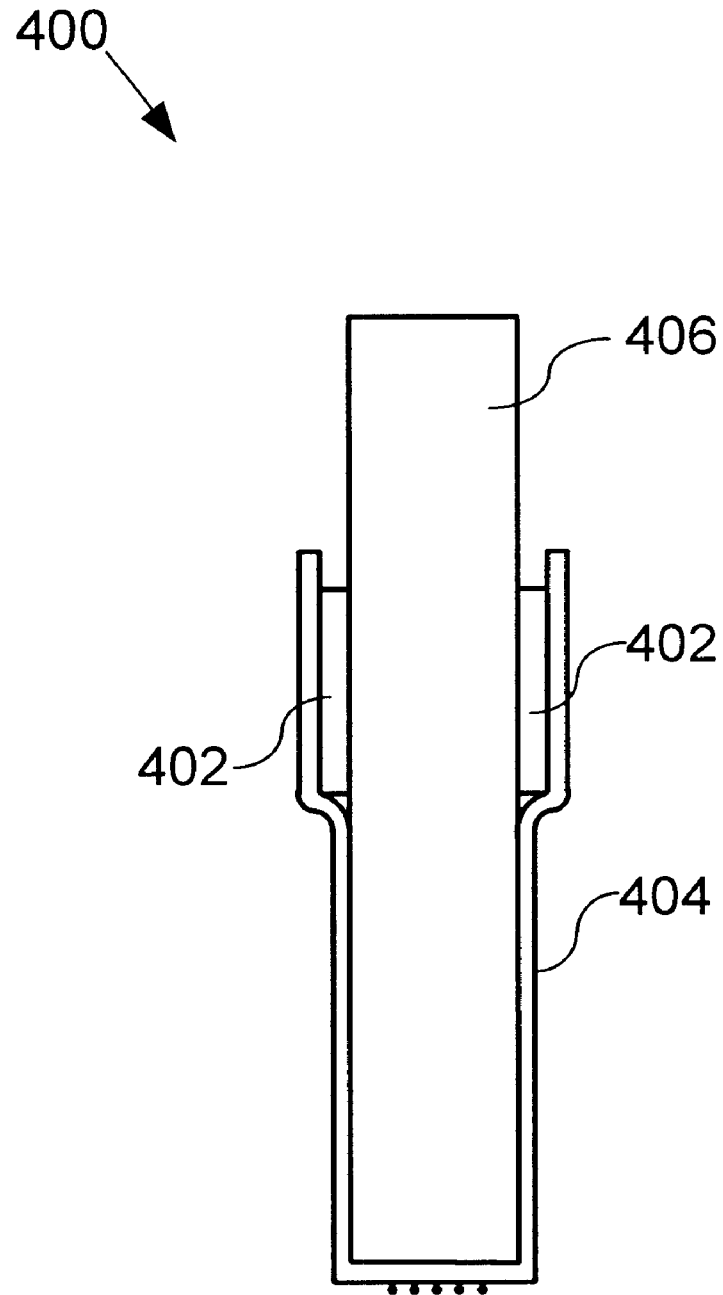
FIG. 4 is a side view of a semiconductor module according to another embodiment of the invention.

FIG. 4 is a side view of a semiconductor module 400 according to another embodiment of the invention. In this embodiment, semiconductors 402 on a flexible circuit 404, are bonded directly to a heat spreader 406. The bond may be by any means but is preferably made by gluing the semiconductors 402, with an epoxy or the like, to the side of the heat spreader 406. The glue is chosen to closely match the thermal expansion properties of the semiconductor 402, heat spreader 406 and flexible circuit 404. The glue should also have good thermal conduction properties. This embodiment, where the semiconductors 402 are bonded directly to the heat spreader, 406 is favored due to the direct convection of heat from the semiconductors 402 to the heat spreader 406.

Figure 5:
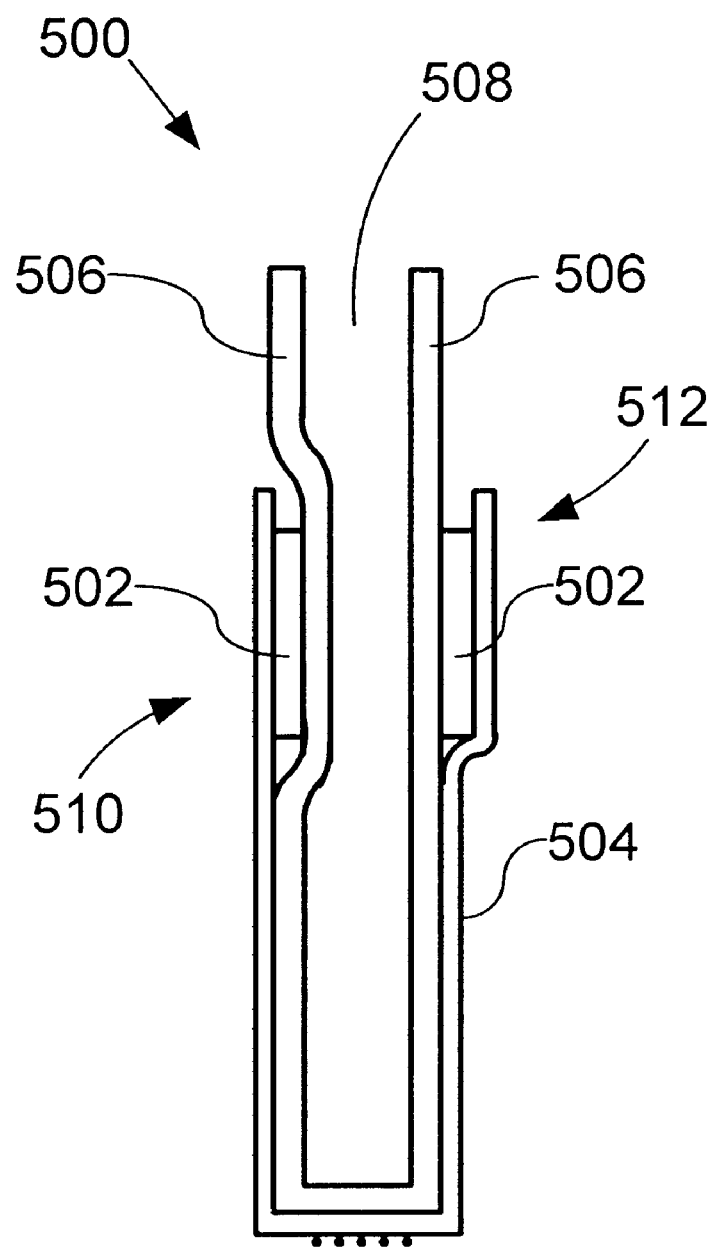
FIG. 5 is a side view of a semiconductor module according to yet another embodiment of the invention.

FIG. 5 is a side view of a semiconductor module 500 according to yet another embodiment of the invention. In this embodiment, the heat spreader 506 has a "u" shape defining a channel 508. This embodiment provides the benefit of increasing the surface area of the heat spreader 506 exposed to the surrounding air, thus increasing the rate that heat generated by the semiconductors 502 is dissipated to the surrounding air. Either the heat spreader 506 may conform to the shape of the flexible circuit 504 and semiconductor 502, or the flexible circuit 504 and semiconductor 502 may conform to the shape of the heat spreader 506. Both of these configurations are shown in FIG. 5, at 510 and 512 respectively.

Figure 6:
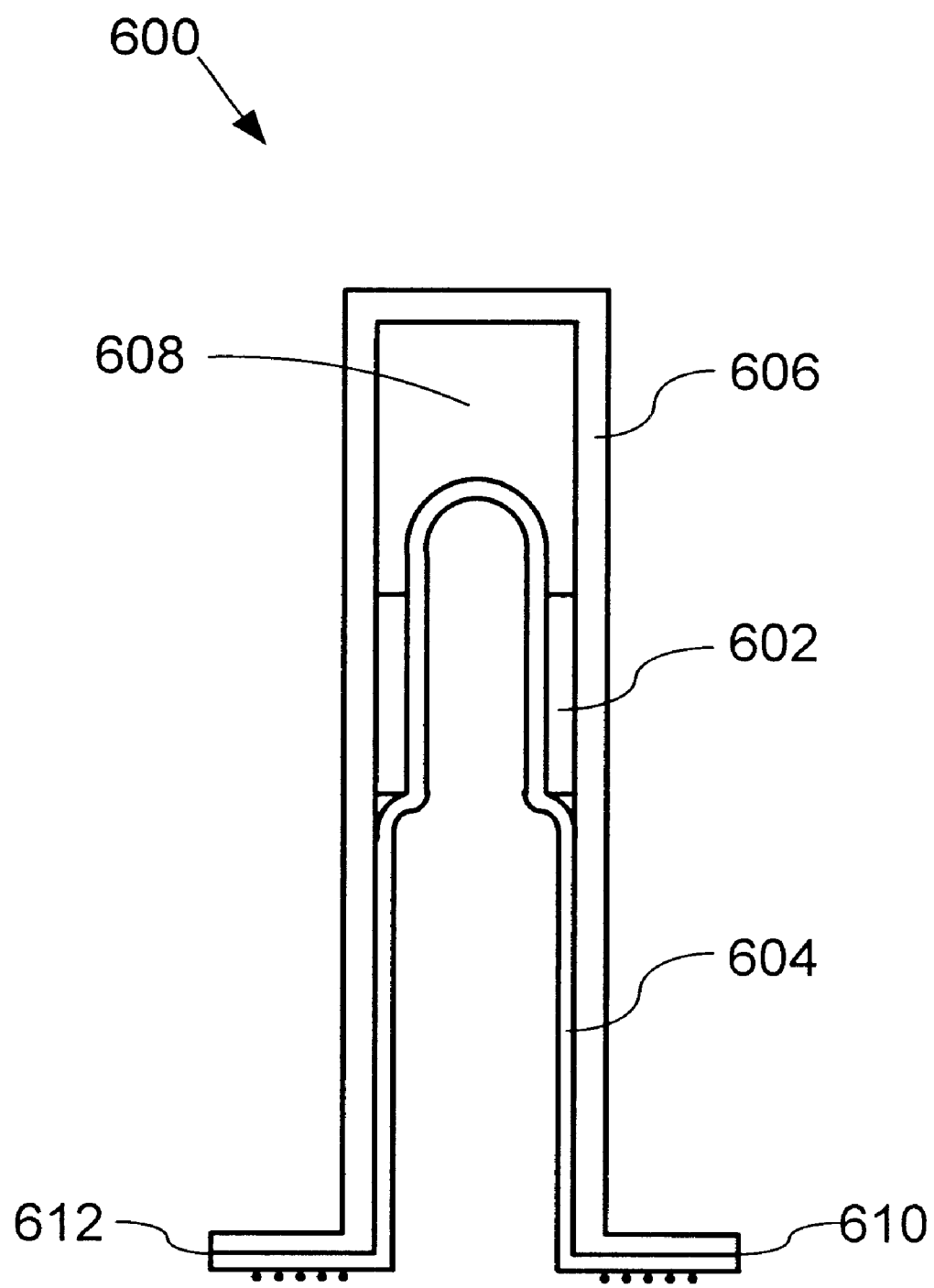
FIG. 6 is a side view of a semiconductor module according to still another embodiment of the invention.

FIG. 6 is a side view of a semiconductor module 600 according to still another embodiment of the invention. In this embodiment, the heat spreader 606 is in a "n" shape forming an interior channel 608. This embodiment also provides the benefit of increasing the surface area of the heat spreader 606 exposed to the surrounding air, thus increasing dissipate heat generated by the semiconductor 702 is dissipated to the surrounding air. In this embodiment, the heat dissipating external surfaces may further dissipate heat by being exposed to an external air circulation device (e.g. a fan).

In the embodiments shown in FIGS. 1 to 5, signal channels in an electronic device may enter and exit the semiconductor module at electrical contact points in one area or footprint at the base of the heat spreader, as shown at 110 of FIG. 1. In the embodiment shown in FIG. 6, however, signal channels in an electronic device enter the semiconductor module 600 at electrical contact points 610 and exit from electrical contact points 612.

Figure 7:
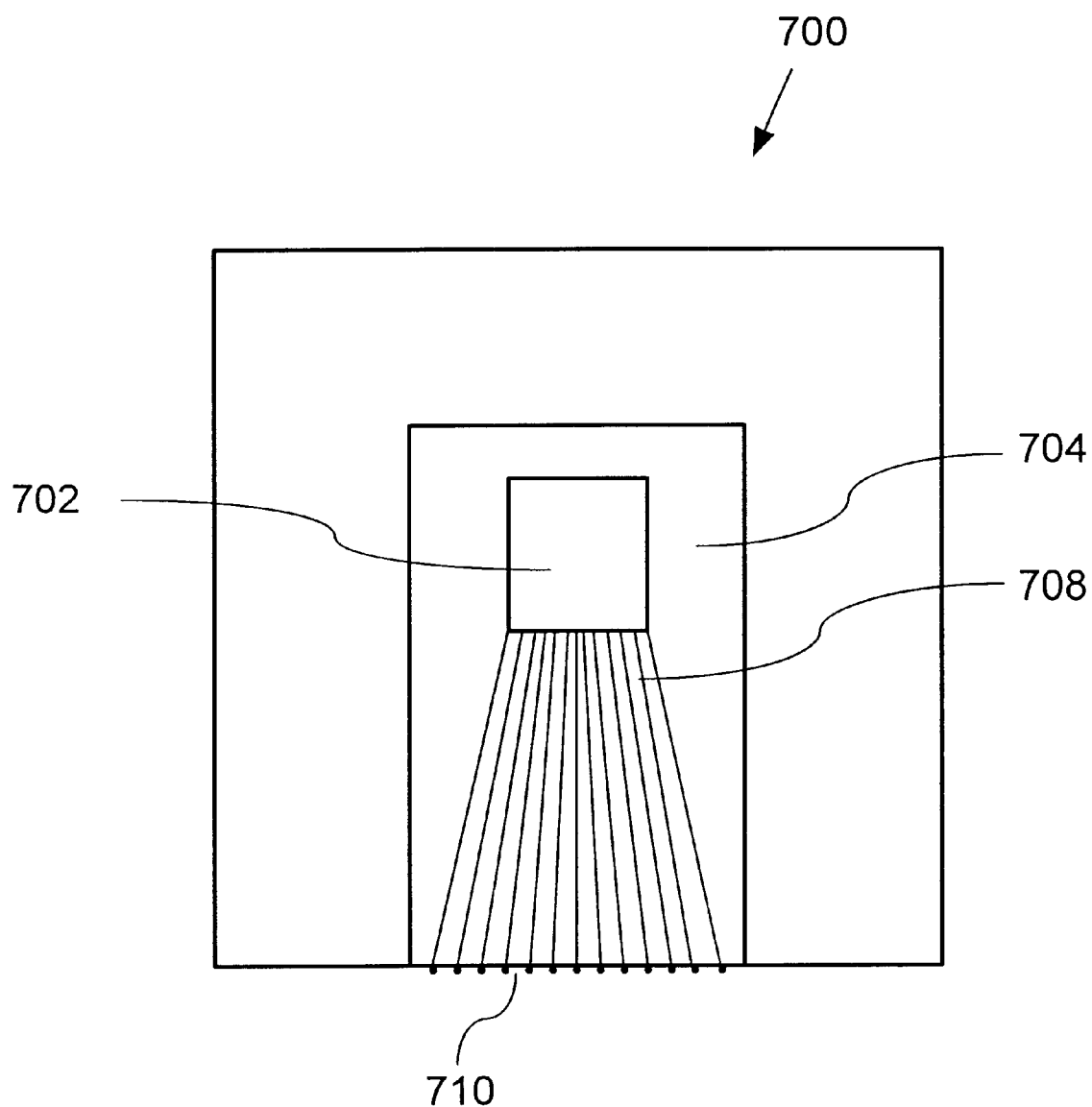
FIG. 7 is a front view of a semiconductor module according to another embodiment of the invention.

FIG. 7 is a side view of a semiconductor module 700 according to another embodiment of the invention. In this embodiment, leads 708 fan out on the flexible circuitry 704. That is, the leads 708 in the flexible circuitry 704 are closer together at the semiconductor 702 than at the array 710, which is more spread out than that shown in FIG. 1. The fanned out leads 708 create a more dispersed array with contact points 710 spaced further from one another. This embodiment compensates for a constant size footprint should larger semiconductors 702 be incorporated into the module at a later stage.

Figure 8:
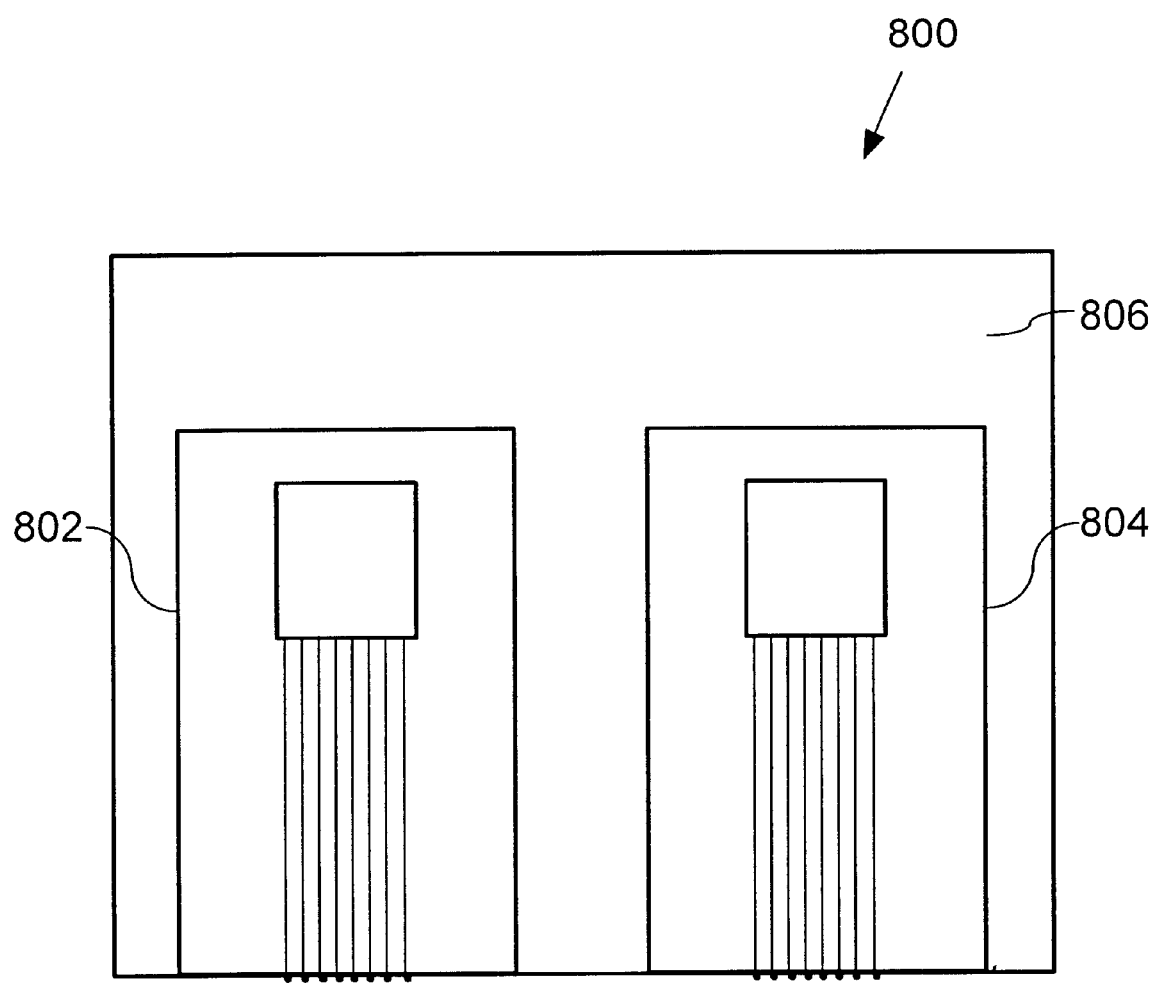
FIG. 8 is a front view of a semiconductor module according to yet another embodiment of the invention.

FIG. 8 is a side view of a semiconductor module 800 according to yet another embodiment of the invention. In this embodiment, two tape and semiconductor combinations 802 and 804 are placed on one heat spreader 806. Thus, the apparatus of FIG. 8 processes two or more separate signal channels with a single heat spreader 806.

Figure 9:
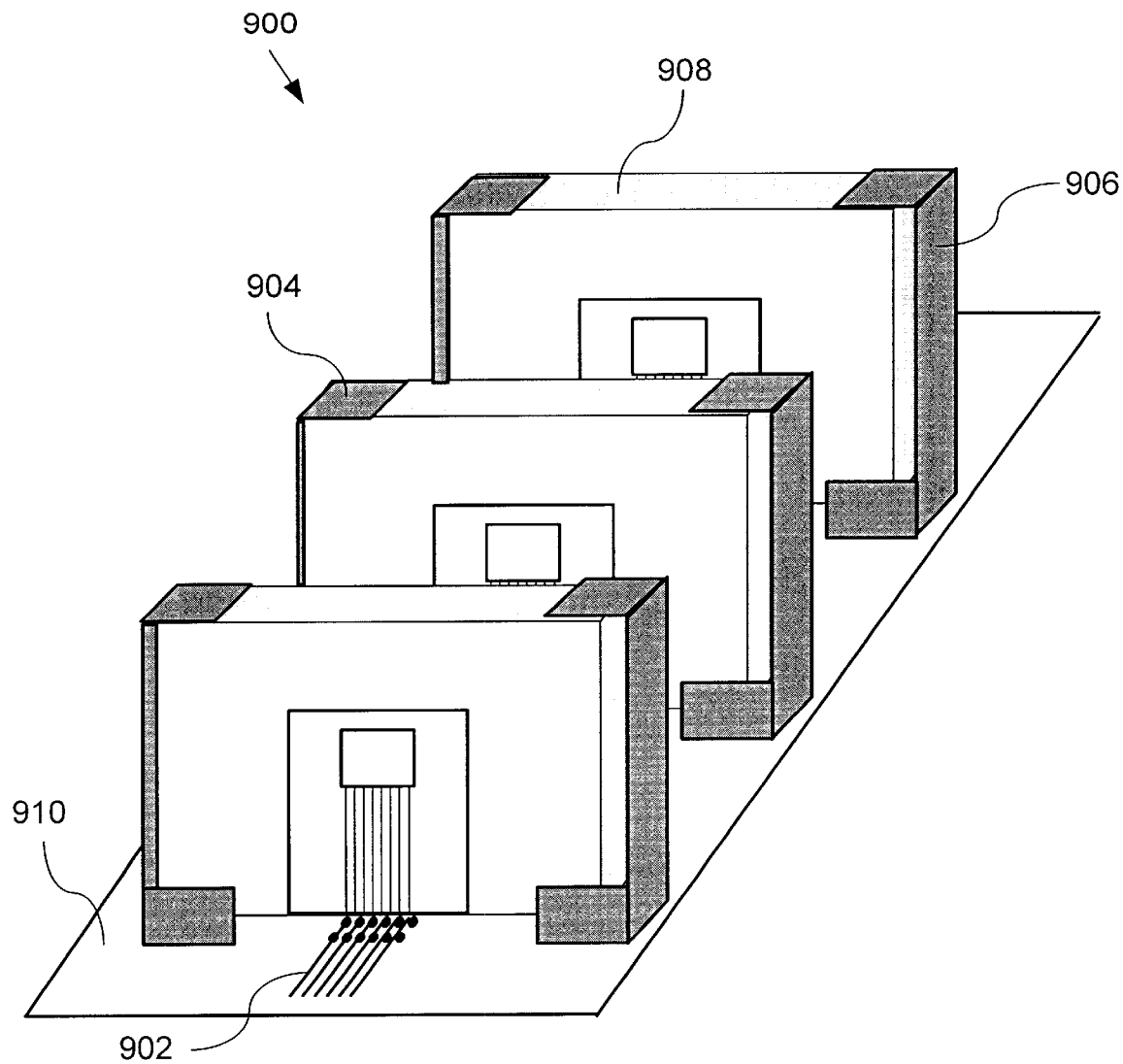
FIG. 9 is a perspective view of multiple semiconductor modules installed on a printed circuit board.

FIG. 9 is a perspective view 900 of multiple semiconductor modules 908 installed on a printed circuit board (PCB). The semiconductor modules 908 may be placed directly onto channels 902 on a PCB 910 or other suitable substrate, such that each electrical contact point electrically connects with a channel 902.

The semiconductor modules 908 may be placed directly onto a PCB 910, such as a motherboard, or alternatively onto an in-line memory module circuit card which in turn slots into another PCB, such as a motherboard. In this manner the footprint of an in-line memory module circuit card may remain constant even if additional semiconductor modules 908 are slotted onto the in-line memory module circuit card. As the footprint of the array is always constant, the in-line memory module circuit card does not have to be changed each time additional memory is required, thereby enhancing the upgradability of electronic devices. The invention provides a memory module with a small footprint. Adding further chips to the module does not effect the footprint.

When in an aligned position, each electrical contact point electrically connects with a corresponding electrical contact on the substrate or PCB. Where the electrical contact points are solder bumps, the electrical connection between the semiconductor module and the PCB may be made by heating the solder bumps to cause reflow of the solder and allowing subsequent cooling, thereby fusing the semiconductor module 908 to the PCB 910.

Alternatively, or in addition, fastening mechanisms 904 and 906 may be provided for securely anchoring the semiconductor modules 908 onto the PCB 910. Such fastening mechanisms 904 and 906 may include clamps, slots, or the like.

Figure 10:
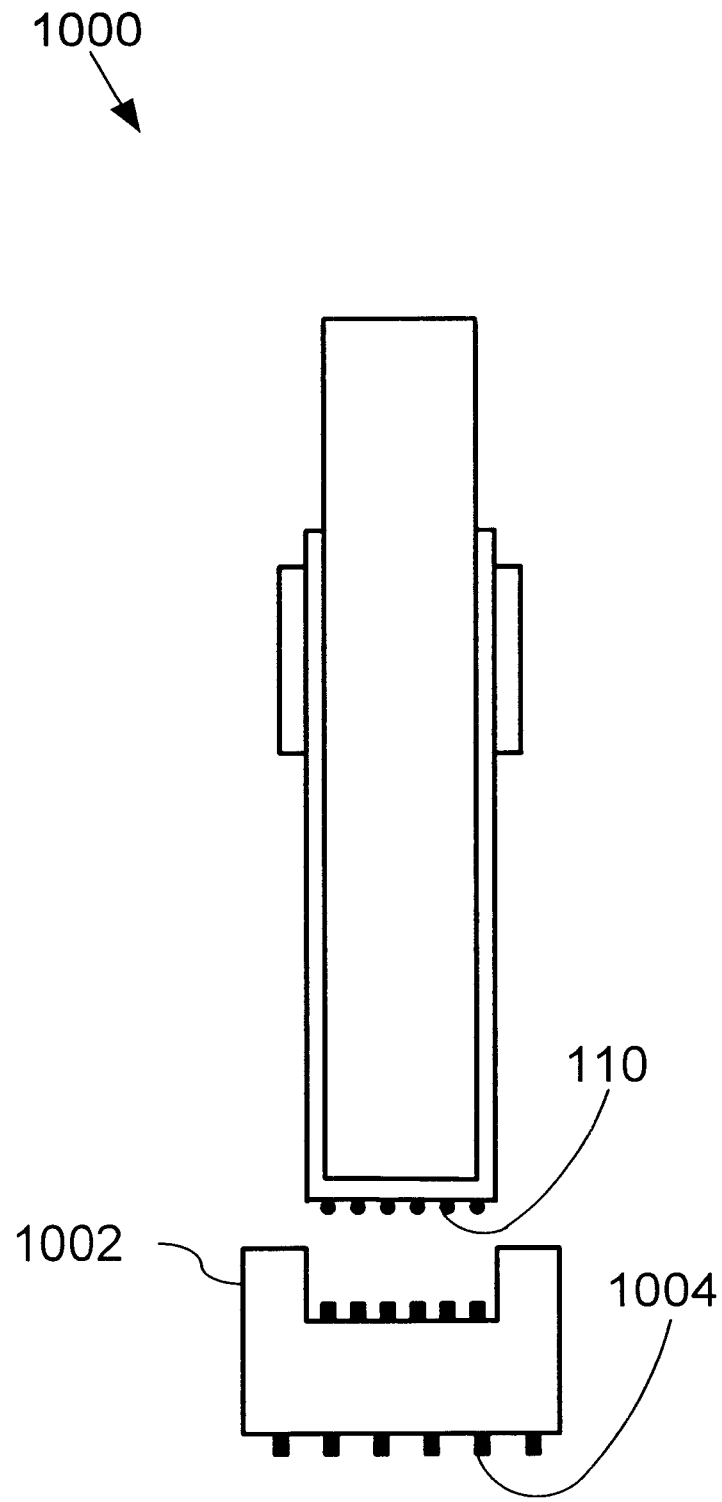
FIG. 10 is a side view of a semiconductor module according to a final embodiment of the invention.

FIG. 10 is a side view of a semiconductor module 1000 according to a final embodiment of the invention. In this embodiment the semiconductor module 1000 connects to a pin grid array (PGA) socket or slot 1002, which in turn connects to a PCB. This embodiment is especially useful when connecting a semiconductor module to PCB's with incompatible footprints. In this way, a semiconductor module 1000 with a footprint created by electrical contact points 110, may be connected to a PCB with a different footprint, where electrical contacts 1004 on the PGA slot 1002 are arranged to correspond with the footprint on the PCB.

Figure 11:
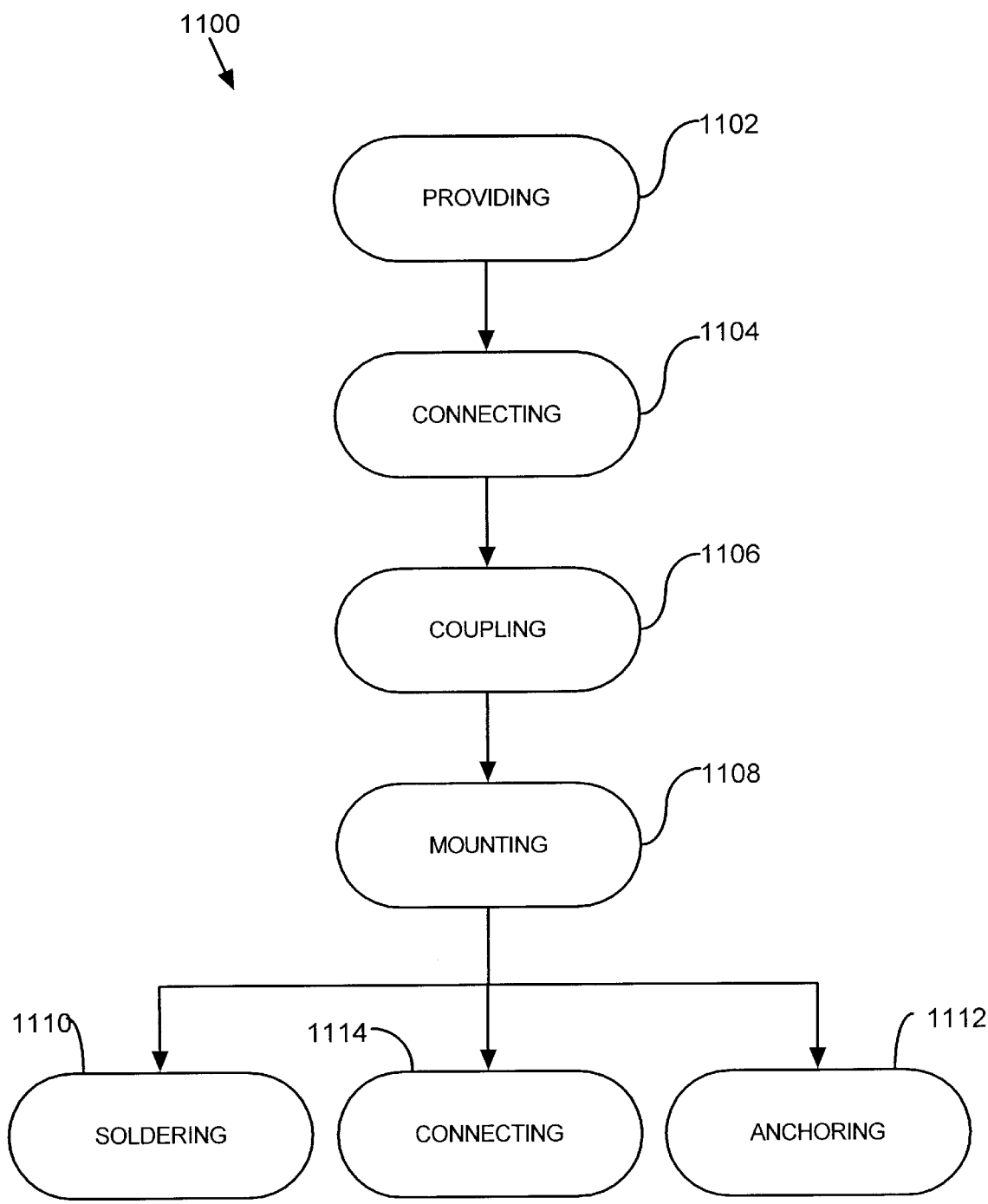
FIG. 11 is a flow chart of a method of making a semiconductor module according to an embodiment of the invention.

FIG. 11 is a flow chart of a method 1100 of making a semiconductor module according to an embodiment of the invention. A plurality of electrically conductive leads are provided 1102, preferably on a flexible circuit or tape. Two semiconductors are then electrically connected 1104 to the leads. The semiconductors are then thermally coupled 1106 to a heat spreader. This is preferably done by mounting 1108 the semiconductor directly to opposing walls of the heat spreader as shown in FIGS. 4–6. Alternately, the flexible tape may be used as the contact surface with the heat spreader as shown in FIG. 2. The leads may then be soldered 1110 to a PCB. The module may also be anchored 1112 to the PCB by means of a fastening mechanism as discussed above. Alternatively, the module may connect 1114 to a PGA as described in relation to FIG. 10. Anchoring 1112, soldering 1110, and connecting 1114 may occur simultaneously.

In an alternative embodiment, a semiconductor package such as a CSP may have its solder balls attached to the flexible circuitry. The combination of the semiconductor package and the flexible circuitry is then bonded to the heat spreader. In this manner existing semiconductor packages may be used to manufacture the semiconductor module according to the invention.

Another alternative embodiment may include shielding to protect the semiconductor from electromagnetic forces. In addition, adhesive may be placed between the tape and the base of the heat spreader to cushion the contact points and ensure contact between the contact points and the PCB.

The semiconductor module of the invention eliminates the need for a separate heat spreader. The invention reduces overall cost and weight through shared common contact points or nodes. The common contact points also allow for a constant footprint to be maintained independent of the size or number of semiconductors used. Furthermore, the module is reliable as the semiconductors are not exposed to as high thermal stresses. The module also substantially improves heat dissipation by exposing greater surface areas to the surrounding air.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. The presently disclosed embodiments are therefore to be considered in all respects as illustrative and not restrictive, the scope of the invention being indicated by the appended claims, and not limited to the foregoing description.

What is claimed is:

1. A semiconductor module, comprising:
   a heat spreader comprising separate first and second regions for connecting to channels of a substrate;
   at least two semiconductors thermally coupled to said heat spreader;
   a plurality of electrically conductive leads electrically connected to said semiconductors, where at least one of said electrically conductive leads is common to both of said semiconductors;
   a first set of electrical contact points disposed on said first region and electrically connected to said plurality of electrically conductive leads, where said first set of electrical contact points is for ingress of electrical signals from said channels to at least one of said at least two semiconductors; and
   a second set of electrical contact points disposed on said second region and electrically connected to said plurality of electrically conductive leads, where said second set of electrical contact points is for egress of electrical signals to said channels from at least one of said at least two semiconductors, and where said first and second sets of electrical contact points are separate and distinct from one another, and where at least some of said first set of electrical contact points, said plurality of electrically conductive leads, and said second set of electrical contact points form a continuous signal channel for ingress and egress of said electrical signals from and to said channels.

2. A semiconductor module according to claim 1, wherein said two semiconductors are mounted on opposing side walls of said heat spreader.

3. A semiconductor module according to claim 2, wherein each of said semiconductors are bonded directly to said side wall of said heat spreader.

4. A semiconductor module according to claim 1, wherein said electrically conductive leads form part of a flexible circuit at least partially attached to said heat spreader.

5. A semiconductor module according to claim 4, wherein said flexible circuit is a flexible dielectric tape.

6. A semiconductor module according to claim 5, wherein said flexible circuit is bonded directly to said side wall of said heat spreader.

7. A semiconductor module according to claim 1, wherein each of said first and second sets of electrical contact points form an array of electrical contacts points between said heat spreader and a circuit board.

8. A semiconductor module according to claim 7, wherein each of said first and second sets of electrical contact points are located at a base of said heat spreader.

9. A semiconductor module according to claim 7, wherein each of said first and second sets of contact points is an array of solder balls.

10. A semiconductor module according to claim 1, wherein said heat spreader is a solid block of heat dissipating material.

11. A semiconductor module according to claim 1, wherein said heat spreader is "u" shaped.

12. A semiconductor module according to claim 1, wherein said heat spreader is "n" shaped.

13. A semiconductor module according to claim 7, wherein each of said first and second sets of electrical contacts points connects to a printed circuit board.

14. A semiconductor module according to claim 7, wherein each of said first and second sets of electrical contacts points connects to an in-line memory module.

15. A semiconductor module according to claim 1, wherein said semiconductor module further comprises a fastening mechanism for anchoring said semiconductor module to a printed circuit board.

16. A method of making a semiconductor module, comprising:
providing a plurality of electrically conductive leads;
electrically connecting at least two semiconductors to said plurality of electrically conductive leads, where at least one of said electrically conductive leads is common to both of said semiconductors;
thermally coupling said semiconductors to a heat spreader comprising separate first and second regions for connecting to channels of a substrate;
electrically connecting said plurality of electrically conductive leads to a first set of electrical contact points disposed on said first region, where said first set of electrical contact points is for ingress of electrical signals from said channels to at least one of said at least two semiconductors;
electrically connecting said plurality of electrically conductive leads to a second set of electrical contact points disposed on said second region, where said second set of electrical contact points is for egress of electrical signals to said channels from at least one of said at least two semiconductors, and where said first and second sets of electrical contact points are separate and distinct from one another, and where at least some of said first set of electrical contact points, said plurality of electrically conductive leads, and said second set of electrical contact points form a continuous signal channel for ingress and egress of said electrical signals from and to said channels.

17. A method of making a semiconductor module according to claim 16, further comprising the step of wrapping said electrically conductive leads around at least two sides of said heat spreader.

18. A method of making a semiconductor module according to claim 16, further comprising the step of directly mounting said semiconductors on opposing side walls of said heat spreader.

19. A method of making a semiconductor module according to claim 16, further comprising the step of soldering said first and second sets of contact points to a circuit board.

20. A method of making a semiconductor module according to claim 16, further comprising the step of anchoring said semiconductor module to a printed circuit board.

21. A method of making a semiconductor module according to claim 16, further comprising the step of connecting said semiconductor module to a printed circuit board via a pin grid array socket.

22. A semiconductor module according to claim 11, wherein said first set of contact points and said second set of contact points are disposed on a base of said "u" shaped heat spreader, where said base connects two legs of said "u" shaped heat spreader to one another.

23. A semiconductor module according to claim 12, wherein said first set of contact points is disposed near a remote end of a first leg of said "n" shaped heat spreader, and said second set of contact points are disposed near a remote end of a second leg of said "n" shaped heat spreader.

24. A semiconductor module according to claim 23, wherein said first region comprises a first tab extending substantially perpendicular from said remote end of said first leg, and said second region comprises a second tab extending substantially perpendicular from said remote end of said second leg, wherein said first set of contact points are disposed at said first tab, and said second set of contact points are disposed at said second tab.

25. A semiconductor module according to claim 24, wherein said electrically conductive leads form part of a flexible circuit that at least partially conforms to a shape of said heat spreader, and where said flexible circuit is in direct contact with said heat spreader at said first and second tabs.

26. A semiconductor module according to claim 3, wherein each of said semiconductors are bonded directly to said side wall of said heat spreader by a glue having similar thermal expansion properties to said at least two semiconductors.

27. A semiconductor module according to claim 6, wherein said flexible circuit is bonded directly to said side wall of said heat spreader by a glue having similar thermal expansion properties to said flexible circuit.

28. A semiconductor module according to claim 1, wherein said electrically conductive leads fan out from said at least two semiconductors to said first and second sets of contact points.

29. A semiconductor module according to claim 1, wherein said first set of electrical contact points include at least one shared common contact point that electrically connects, via said electrically conductive leads, to said two semiconductors.

30. A semiconductor module according to claim 29, wherein said at least one shared common contact point is selected from the group consisting of a common voltage supply contact point, a reference voltage contact point, an electrical ground contact point and any combinations thereof.

31. A semiconductor module according to claim 1, wherein said second set of electrical contact points include at least one shared common contact point that electrically connects, via said electrically conductive leads, to said two semiconductors.

32. A semiconductor module according to claim 31, wherein said at least one shared common contact point is selected from the group consisting of a common voltage supply contact point, a reference voltage contact point, an electrical ground contact point and any combinations thereof.

33. A semiconductor module according to claim 29, wherein said second set of electrical contact points include at least a second shared common contact point that electrically connects, via said electrically conductive leads, to said two semiconductors.

34. A semiconductor module according to claim 33, wherein said at least second shared common contact point is selected from the group consisting of a common voltage supply contact point, a reference voltage contact point, an electrical ground contact point and any combinations thereof.

35. A semiconductor module according to claim 1, wherein at least one of said first set of electrical contact points is electrically coupled to at least one of said second set of electrical contact points.

* * * * *